US006328844B1

(12) United States Patent
Watanabe et al.

(10) Patent No.: US 6,328,844 B1
(45) Date of Patent: Dec. 11, 2001

(54) FILMY ADHESIVE FOR CONNECTING CIRCUITS AND CIRCUIT BOARD

(75) Inventors: Itsuo Watanabe, Shimodate; Kenzo Takemura, Yuki; Osamu Watanabe, Tsukuba; Naoyuki Shiozawa, Tochigi-ken; Akira Nagai; Kazuyoshi Kojima, both of Tsukuba; Toshiaki Tanaka; Kazunori Yamamoto, both of Tsukuba, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/230,017

(22) PCT Filed: Jul. 15, 1997

(86) PCT No.: PCT/JP97/02455

§ 371 Date: Aug. 24, 1999

§ 102(e) Date: Aug. 24, 1999

(87) PCT Pub. No.: WO98/03047

PCT Pub. Date: Jan. 22, 1998

(30) Foreign Application Priority Data

Jul. 15, 1996 (JP) .................................................. 8-184647
Jul. 18, 1996 (JP) .................................................. 8-189205
Mar. 19, 1997 (JP) .................................................. 9-066899

(51) Int. Cl.$^7$ ................................................... C09J 163/02

(52) U.S. Cl. .............................. 156/330; 29/831; 29/832; 156/292; 523/458

(58) Field of Search ..................................... 428/327, 901; 156/64, 292, 295, 305, 306.9, 330; 29/831, 832, 842, 854, 855, 856; 23/458

(56) References Cited

U.S. PATENT DOCUMENTS

| 4,680,226 | 7/1987 | Takeda . |
| 4,735,847 | * 4/1988 | Fujiwara et al. ..................... 428/209 |
| 4,999,136 | 3/1991 | Su et al. . |

FOREIGN PATENT DOCUMENTS

| 03-016147 | 1/1991 | (JP) . |
| 05-160200 | 6/1993 | (JP) . |
| 06-203627 | 7/1994 | (JP) . |
| 06-260533 | 9/1994 | (JP) . |

* cited by examiner

*Primary Examiner*—Robert Dawson
*Assistant Examiner*—D. Aylward
(74) *Attorney, Agent, or Firm*—Griffin & Szipl, P.C.

(57) ABSTRACT

A heat-active adhesive for a connecting circuit which is used for electrically connecting circuit electrodes facing each other in the pressing direction by heating and pressing the electrodes. The adhesive has an elastic modulus of 100–2,000 MPa at 40° C. after adhesion. The adhesive can contain at least an epoxy resin, acrylic rubber, and a latent curing agent. An acrylic rubber having a glycidryl ether group as a molecule is preferably used as the acrylic rubber.

26 Claims, 2 Drawing Sheets

FILMY ADHESIVE FOR CONNECTING CIRCUITS AND CIRCUIT BOARD

TECHNICAL FIELD

This invention relates to a filmy adhesive for connecting circuits which is used to connect circuit substrates together or to connect electronic parts such as IC chips to a wiring substrate, and also relates to a circuit board.

BACKGROUND ART

To make an electrical interconnection between circuit substrates themselves or between electronic parts such as IC chips and a circuit substrate, an adhesive or an anisotropic conductive adhesive with conductive particles dispersed therein is used. More specifically, the electrical interconnection can be made by providing any of these adhesives between electrodes facing each other, connecting the electrodes by heating and pressing and thereafter imparting a conductivity in the direction of pressing. For example, Japanese Patent Application Laid-open No. 3-16147 discloses an adhesive for connecting circuits which is basically comprised of epoxy resin.

However, conventional adhesives making use of epoxy resin as base resin have a problem that, when reliability tests such as a thermal shock test, a PCT test and a solder bath immersion test are made, the connection resistance may become great or the adhesive may come apart at the joints because of internal stress ascribable to a difference in coefficient of thermal expansion of the connecting substrates.

Especially when chips are directly mounted on a substrate through an adhesive, the chips and substrate tend to warp because of internal stress ascribable to a difference in coefficient of thermal expansion between them when a printed substrate making use of an FR-4 base material or a flexible wiring board comprised of a polyimide or polyester base material is used as the connecting substrate.

SUMMARY OF THE INVENTION

The filmy adhesive for connecting circuits according to the present invention comprises a heat-activated adhesive for electrically connecting electrodes in the pressing direction by heating and pressing circuit electrodes facing each other, wherein the adhesive has a modulus of elasticity of from 100 to 2,000 MPa at 40° C. after adhesion.

This adhesive may contain at least an epoxy resin, an acrylic rubber and a latent curing agent, and the acrylic rubber may have a glycidyl ether group in the molecule. Such an adhesive may preferably be used.

The filmy adhesive for connecting circuits according to the present invention is also characterized in that, in a heat-activated adhesive for electrically connecting electrodes in the pressing direction by heating and pressing circuit electrodes facing each other, the adhesive contains at least an epoxy resin, an acrylic rubber having a glycidyl ether group in the molecule, and a latent curing agent.

In the above filmy adhesive for connecting circuits according to the present invention, the area of the adhesive after connection may preferably be from 2.0 to 5.0 times the area before connection.

The circuit board of the present invention comprises;
a first circuit member having a first connecting terminal; and
a second circuit member having a second connecting terminal;
the first connecting terminal and the second connecting terminal being so provided as to face each other; and
the first connecting terminal and the second connecting terminal being electrically connected by heating and pressing them through an adhesive put between the first connecting terminal and the second connecting terminal which face each other;
the adhesive having a modulus of elasticity of from 100 to 2,000 MPa at 40° C. after adhesion.

The circuit board of the present invention also comprises;
a first circuit member having a first connecting terminal; and
a second circuit member having a second connecting terminal;
the first connecting terminal and the second connecting terminal being so provided as to face each other;
the first connecting terminal and the second connecting terminal being electrically connected by heating and pressing them through an adhesive put between the first connecting terminal and the second connecting terminal which face to each other; and
the adhesive containing at least an epoxy resin, an acrylic rubber having a glycidyl ether group in the molecule, and a latent curing agent.

In the circuit board of the present invention, it is preferable that the first circuit member having a first connecting terminal is a semiconductor chip; and the second circuit member having a second connecting terminal is an organic insulating substrate having a second connecting terminal.

As the first circuit member having a first connecting terminal, a semiconductor chip may preferably be used; and as the second circuit member having a second connecting terminal, a multi-layer wiring board which has a surface insulating layer on which the second connecting terminal is formed, the given number of insulating layers, a given number of wiring layers provided through the insulating layers, and conductive holes which provide electrical interconnection between given electrodes and given wiring layers; a given number of the insulating layers being formed of a resin reinforced with a glass substrate, and, when the modulus of elasticity of the surface insulating layer as measured by the DVE method is represented by E2, E1, and the modulus of elasticity of the insulating layer formed of a resin reinforced with a glass substrate as measured by the DVE method is represented by $$E1=0.01E2 \text{ to } 0.5E2;$$

or a wiring substrate comprising an insulating substrate in the surface portion of which the second connecting terminal is embedded.

In the above adhesive, from 0.2 to 15% by volume of conductive particles may be dispersed.

BEST MODES FOR WORKING THE INVENTION

The adhesive of the present invention has a modulus of elasticity of from 100 to 2,000 MPa at 40° C. after adhesion.

An adhesive that can attain a good fluidity and a high connection reliability at the time of connection may include an adhesive comprising a mixture of an epoxy resin and a latent curing agent such as an imidazole, a hydrazide, a boron trifluoride-amine complex, a sulfonium salt, amineimide, a polyamine salt and dicyandiamide in which an acrylic rubber having a molecular weight of 200,000 or more is so mixed that the adhesive may have the modulus of elasticity of from 100 to 2,000 MPa at 40° C. after adhesion.

Its modulus of elasticity at 40° C. after adhesion may preferably be from 300 to 1,800 MPa, and more preferably from 700 to 1,800 MPa.

Figure 1:
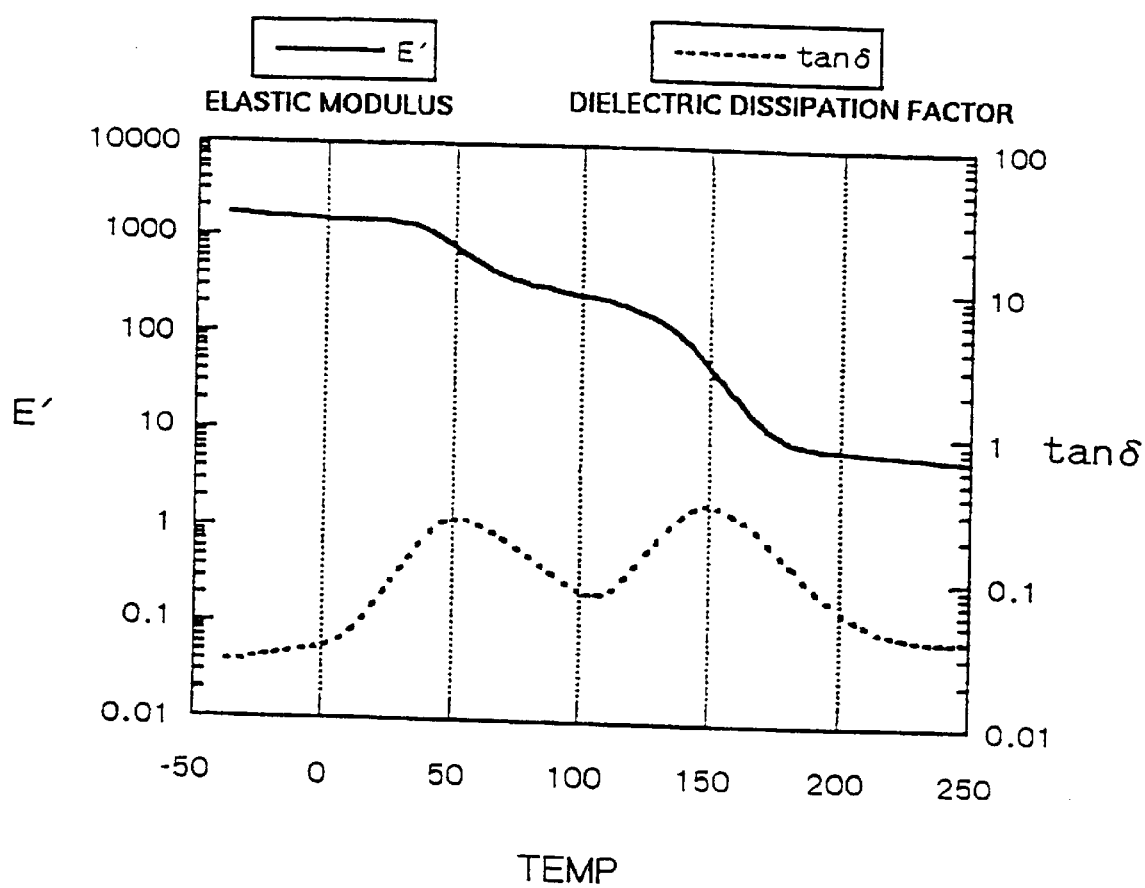
FIG. 1 is a graph showing the modulus of elasticity and dielectric dissipation factor of an adhesive-film cured product of Example 1.

Modulus of elasticity of the adhesive-film cured product which corresponds to the adhesive at the stage after adhesion can be measured with Rheospectra DVE-4 (tensile mode; frequency: 10 Hz; rate of temperature rise: 5° C. /min; measurable range: −40° C. to 250° C.), manufactured by Rheology Ltd. The adhesive film may be cured under the same conditions with respect to the heating temperature and time as in the step of adhesion, and may be cured by immersing the adhesive film in an oil bath. Such an adhesive-film cured product is a film having been completed the generation of heat by 90% or more of the total curing exotherm as measured by DSC. As a typical example, the results of measurement of the modulus of elasticity and dielectric dissipation factor of an adhesive-film cured product prepared in Example 1 are shown in FIG. 1.

The adhesive used in the present invention contains an epoxy resin, an acrylic rubber having a glycidyl ether group in the molecule, and a latent curing agent.

The epoxy resin used in the present invention may include bisphenol type epoxy resins derived from epichlorohydrin and bisphenol A, F or AD; epoxy novolak resins derived from epichlorohydrin and phenol novolak or cresol novolak; naphthalene type epoxy resin having a skeleton including a naphthalene ring; glycidyl amine; glycidyl ether; and various epoxy compounds having two or more glycidyl groups in one molecule such as biphenyl and alicyclics; any of which may be used alone or in the form of a mixture of two or more. These epoxy resins may be high-purity products in which impurity ions (such as $Na^+$ and $Cl^{-1}$), hydrolyzable chlorine and so forth have been decreased to 300 ppm or below, which may preferably be used for preventing electron migration.

The acrylic rubber used in the present invention may include polymers or copolymers having as monomer components at least one of acrylic acid, acrylates, methacrylates and acrylonitrile. In particular, copolymer type acrylic rubbers containing glycidyl acrylate or glycidyl methacrylate having a glycidyl ether group may preferably be used.

These acrylic rubbers may preferably have a molecular weight of 200,000 or more in view of an improvement of cohesive force of the adhesive. If the acrylic rubber is mixed in the adhesive in an amount less than 10% by weight, the modulus of elasticity at 40° C. after adhesion may exceed 2,000 MPa. If it is in an amount more than 40% by weight, the modulus of elasticity can be made low but the adhesive may have so high a melt viscosity at the time of connection that the molten adhesive may be made less removable at the interface between connecting electrodes or between a connecting electrode and conductive particles, and hence it may become impossible to ensure electrical conduction between the connecting electrodes or between the connecting electrode and the conductive particles. Accordingly, the acrylic rubber may preferably be mixed in an amount of from 10 to 40% by weight.

The acrylic rubber mixed in the adhesive shows, with regard to the dielectric dissipation factor attributable to the rubber component, a peak temperature at about 40 to 60° C. as shown in FIG. 1, and hence the adhesive can be made to have a lower modulus of elasticity. The adhesive may also be mixed with a thermoplastic resin such as phenoxy resin, polyester resin or polyamide resin in order to further improve its film-forming properties. In particular, when the epoxy resin is used as the base resin, the phenoxy resin is preferred because it has features of good compatibility and adhesion with the epoxy resin because of its structure analogous to that of the epoxy resin. To form the film, an adhesive composition comprised of at least these epoxy resin, acrylic rubber and latent curing agent is dissolved or dispersed in an organic solvent to prepare a fluid, which is then coated on a releasable base material, and the solvent is removed at a temperature where the curing agent is activated. The solvent used here may preferably be a mixed solvent of an aromatic hydrocarbon type and an oxygen-containing type because it can improve the solubility of materials.

In the adhesive of the present invention, conductive particles may be mixed and dispersed in order to level the differences in height of chip bumps and substrate electrodes and for the purpose of positively imparting an anisotropic conductivity. In the present invention, the conductive particles may be particles of a metal of, e.g., Au, Ag, Cu or solder, and may more preferably be those comprised of spherical core materials of a polymer such as polystyrene and on which conductive layers of Ni, Cu, Au or solder have been provided. Surface layers of Sn, Au or solder may further be formed on the surfaces of the conductive particles. Their particle diameter must be smaller than the minimum gap between the electrodes on a substrate. When the electrodes have a difference in height, the particle diameter must be greater than the difference in height, and may preferably be from 1 to 10 μm. The conductive particles may be dispersed in the adhesive in an amount of from 0.1 to 30% by volume, and preferably from 0.2 to 15% by volume.

The adhesive of the present invention is used as a filmy adhesive.

The filmy adhesive can be obtained by coating an adhesive solution on a releasable film by means of a roll coater or the like, followed by drying to form an adhesive layer, and peeling it from the releasable film.

The adhesive layer in the filmy adhesive may be formed in a multi-layer structure. For example, those which may be used are a double-layered anisotropic conductive film formed by lamination of an adhesive film filled with conductive particles in order to impart anisotropic conductivity and an adhesive layer not filled with conductive particles, and a triple-layered anisotropic conductive film formed by lamination of an adhesive film not filled with conductive particles, on each side of an adhesive film filled with conductive particles. These multi-layered anisotropic conductive films can capture conductive particles on the connecting electrode with good efficiency, and hence are advantageous for narrow-pitch connection. Taking account of adhesion to circuit members, an adhesive film having a good adhesion may be laminated to each of one circuit member and another circuit member to form a multi-layer structure.

An inorganic filler may be mixed and dispersed in the adhesive of the present invention.

The inorganic filler may include, but is not particularly limited to, e.g., powders such as fused silica, crystalline silica, calcium silicate, alumina and calcium carbonate. The inorganic filler may preferably be mixed in an amount of from 10 to 200 parts by weight based on 100 parts by weight of the adhesive resin composition. In order to lower the coefficient of thermal expansion, it is effective to mix it in a larger quantity. If, however, it is mixed in a too large quantity, the adhesive may be less adherent or may be made less removable at the joints, which causes faulty conduction. If it is mixed in too small a quantity, the coefficient of thermal expansion can not be made sufficiently low. Accordingly, it may more preferably be mixed in an amount of from 20 to 90 parts by weight. It may also preferably have an average particle diameter made not larger than 3 microns for the purpose of preventing faulty conduction at the joints. It is also desirable to use a spherical filler for the purpose of preventing the resin from decreasing in fluidity at the time of connection and the passivation films of chips from being damaged. The inorganic filler may be mixed and dispersed together with the conductive particles or in a layer where no conductive particles are used.

The circuit-connecting filmy adhesive of the present invention may preferably have, after connection, an adhesive area of from 2.0 to 5.0 times the area before connection.

The ratio of adhesive area after connection to that before connection is measured in the following way: An adhesive of 50 μm in thickness and 5 mm×5 mm in size is held between two sheets of glass of 1.1 mm in thickness and 15 mm×15 mm in size, in the state of which these are heated and pressed by means of a heat contact-bonding machine under conditions of a heating temperature of 180° C., a pressure of 18 kgf/cm$^2$ and a pressing time of 20 seconds. Adhesive area (A) before heating and pressing and adhesive area (B) after heating and pressing are measured with an image processor, and thus the ratio (B/A) of the adhesive area after connection to that before connection can be determined.

If the ratio (B/A) of the adhesive area after connection to that before connection is less than 2.0, the molten adhesive may be made less removable at the interface between connecting electrodes or between a connecting electrode and conductive particles, and hence it may become difficult to ensure electrical conduction between the connecting electrodes or between the connecting electrode and the conductive particles. If, on the other hand, the ratio (B/A) of the adhesive area after connection to that before connection is more than 5.0, the adhesive may have too high a fluidity at the time of connection which tends to cause air bubbles, and tends to result in a low reliability.

In adhesives having a modulus of elasticity higher than 2,000 MPa at 40° C. after connection as in conventional adhesives for connecting circuits, the connection resistance may become great or the adhesive may come apart at the joints because of internal stress caused during the reliability tests such as a thermal shock test, a PCT test and a solder bath immersion test. According to the present invention, however, the adhesive has a modulus of elasticity of from 100 to 2,000 MPa at 40° C. after adhesion, and hence it can absorb the internal stress caused during the reliability tests. Thus, the connection resistance does not become great and the adhesive does not come apart at the joints even after the reliability tests, bringing about a great improvement in the connection reliability.

In the present invention, the circuit member may include chip parts such as semiconductor chips, resistor chips and capacitor chips, and substrates such as printed substrates and flexible wiring boards comprised of polyimide or polyester as a base material, any of which may be used.

To these circuit members, connecting terminals are provided usually in a large number (although they may be single in some cases), where at least one set of the circuit members is disposed opposite to at least part of connecting terminals provided on these circuit members, and the adhesive is put between the connecting terminals disposed opposite to each other, followed by heating and pressing to electrically connect the oppositely disposed connecting terminals to make up a circuit board.

By heating and pressing at least one set of the circuit members, the oppositely disposed connecting terminals are electrically connected to each other in direct contact or through the conductive particles of the anisotropic conductive adhesive.

On the electrode pads of semiconductor chips or substrates, projected electrodes such as bumps formed by plating or wire bumps may be provided for use as connecting terminals. The wire bumps may be obtained when tips of gold wires are melted using a welding torch or the like to form gold balls, then the balls are contact-bonded onto the electrode pads, and thereafter the wires are cut.

Thus, those usable in the terminals of semiconductor chips are plated bumps formed by plating gold, nickel, solder or the like to form projected electrodes; ball bumps which are projected electrodes constituted of metal wires such as gold or aluminum wires whose tips are made into balls by heat energy and contact-bonded onto semiconductor chip electrode pads where the connecting terminals are made up, the metal wires being cut thereafter; solder balls; molten-solder molded bumps; and projected electrodes formed by, e.g., the soldering of columns.

Using the adhesive of the present invention, the semiconductor chips can be packaged on a substrate (i.e. chip-packaging substrate) in which electrodes (i.e. connecting terminals) corresponding to semiconductor chip terminals have been formed.

As the above chip-packaging substrate, an organic insulating substrate in which the electrodes (i.e. connecting terminals) corresponding to semiconductor chip terminals have been formed may be used. Those usable as the organic insulating substrate are films of synthetic resins such as polyimide resin and polyester resin, or laminated sheets formed by impregnating glass substrates such as glass cloth and glass nonwoven fabric with synthetic resins such as polyimide resin, polyester resin and phenol resin followed by curing.

As the chip-packaging substrate, a multi-layer wiring board may also be used which has electrodes connected with chip terminals, a surface insulating layer on which the electrodes are formed, a given number of insulating layers, a given number of wiring layers provided through the respective insulating layers, and holes made conductive which provide electrical interconnection between given electrodes and given wiring layers. The multi-layer wiring board may preferably be used in which the above given number of insulating layers are each formed of a resin reinforced with a glass substrate, and, when the modulus of elasticity of the surface insulating layer as measured by the DVE method is represented by E1 and the modulus of elasticity of the insulating layer formed of a resin reinforced with a glass substrate as measured by the DVE method is represented by E2, $$E1=0.01E2 \text{ to } 0.5E2.$$

In such a multi-layer wiring board, the surface insulating layer may also preferably be a layer having a modulus of elasticity, as measured by the DVE method, of;

$10^2$ to $10^4$ MP at 25° C.,
10 to $10^3$ MP at 100° C.

Such a multi-layer wiring board may preferably be a built-up multi-layer wiring board comprising a substrate constituted of an insulating layer making use of glass cloth or a wiring substrate having at least one layer of conductor circuit, and having alternately formed thereon insulating layers and conductor circuit layers.

The surface insulating layer may make use of a resin film. Those usable as this resin film are films of epoxy resins, polyimide resins, polyamide-imide resins, modified polyphenylene ether resins, phenoxy resins, amide-epoxy resins, phenol resins and mixtures or copolymers of any of these, and heat-resistant thermoplastic engineering plastic films of polysulfone, polyether sulfone, polyether ether ketone, wholly aromatic liquid-crystal polyesters and fluorine resins.

Those comprising any of these resin films and in which an organic or inorganic filler is contained may be used.

As the insulating layer formed of a resin reinforced with a glass substrate, a prepreg may be used which is obtained by impregnating a glass substrate such as glass cloth or glass nonwoven fabric with a resin such as epoxy resin or phenol resin followed by curing.

As the chip-packaging substrate, a wiring substrate comprising an insulating substrate in the surface portion of which the electrodes connected with the chip terminals are embedded is used. Such a wiring substrate may be obtained by forming a nickel thin layer on a conductive provisional substrate such as a copper foil or stainless steel sheet, coating a plating resist on the part other than the areas where the electrodes are formed, followed by electroplating of copper to form electrodes, pressing an insulating layer such as a polyimide film or a glass-substrate epoxy resin prepreg against the electrode surfaces so that the copper electrodes are embedded in the insulating layer, and mechanically or chemically peeling and removing the conductive provisional substrate and the nickel thin layer. It may also be obtained by forming a nickel thin layer or a copper layer on the conductive provisional substrate, coating an etching resist on the areas where the electrodes are formed, followed by etching to form electrodes, and subsequently repeating the same procedure. Such a wiring substrate brings about an improvement in repairing performance of semiconductor chips.

According to the adhesive of the present invention, because of its modulus of elasticity of from 100 to 2,000 MPa at 40° C. after adhesion, any internal stress produced when reliability tests such as thermal shock, PCT and solder bath immersion tests are made can be absorbed, and the connection resistance does not become great, and neither does the adhesive come apart at the joints even after the reliability tests, bringing about an improvement in connection reliability. Also, the filmy adhesive is easy to handle. Accordingly, the adhesive of the present invention may preferably be used to electrically connect an LCD panel to TAB materials, TAB materials to a flexible circuit substrate, an LCD panel to IC chips and IC chips to a printed substrate only in the direction of pressing at the time of connection. The circuit board of the present invention has a superior connection reliability because the connection resistance does not become great, and also the adhesive does not come apart at the joints even after the reliability tests.

EXAMPLE 1

In 400 g of ethyl acetate, 50 g of phenoxy resin (PKHC, available from Union Carbide) and 125 g of an acrylic rubber (a copolymer of 40 parts of butyl acrylate, 30 parts of ethyl acrylate, 30 parts of acrylonitrile and 3 parts of glycidyl methacrylate; molecular weight: 850,000) was dissolved to obtain a 30% solution. Then, 325 g of a liquid epoxy containing a microcapsular latent curing agent (epoxy equivalent weight: 185; NOVACURE HX-3941, available from Asahi Chemical Industry Co., Ltd.) was added to this solution, followed by stirring and further by dispersion of 2% by volume of nickel particles (diameter: 5 μm) to obtain a film coating fluid. This fluid was coated on a separator (a polyethylene terephthalate film treated with silicone; thickness: 40 μm) by a roll coater, followed by drying at 100° C. for 10 minutes to produce an adhesive film of 45 μm thick. A cured product of this adhesive film had a modulus of elasticity of 800 MPa⁻ at 40 ° C. as measured with a dynamic viscoelasticity measuring device. Next, using the adhesive film thus produced, a chip (10×10 mm; thickness: 0.5 mm) with gold bumps (area: 80×80 μm; space: 30 μm; height: 15 μm; number of bumps: 288) was connected to a Ni/Au-plated Cu circuit printed substrate in the following way: The adhesive film (12×12 mm) was stuck to the Ni/Au-plated Cu circuit printed substrate (electrode height: 20 μm; thickness: 0.8 mm) at 80° C. and 10 kgf/cm². Thereafter, the separator was peeled off, and registration was made between the bumps of the chip and the Ni/Au-plated Cu circuit printed substrate (thickness: 0.8 mm). Subsequently, heat and pressure were applied from above the chip under conditions of 180° C., 75 g/bump and 20 seconds to carry out main connection. After the main connection, the chip was warped to an extent of 4.8 μm (a warp which was convex to the chip side). The connection resistance after the main connection was 15 mΩ at maximum and 8 mΩ on average, per bump, and the insulation resistance was $10^8$Ω or above. These values did not change even after a 1,000-cycle thermal shock test at −55 to 125° C., a 200-hour PCT test (121° C., 2 atmospheric pressures) and a 260° C. solder bath immersion test for 10 seconds, showing a good connection reliability.

EXAMPLE 2

In 525 g of ethyl acetate, 50 g of phenoxy resin and 175 g of the same acrylic rubber as in Example 1 was dissolved to obtain a 30% solution. Then, 275 g of a liquid epoxy (epoxy equivalent weight: 185) containing a microcapsular latent curing agent was added to this solution, followed by stirring and further by dispersion of 2% by volume of nickel particles (diameter: 5 μm) to obtain a film coating fluid. This fluid was coated on a separator (a polyethylene terephthalate film treated with silicone; thickness: 40 μm) by a roll coater, followed by drying at 100° C. for 10 minutes to produce an adhesive film of 45 μm thick. A cured product of this adhesive film had a modulus of elasticity of 400 MPa at 40° C. as measured with a dynamic viscoelasticity measuring device. Next, using the adhesive film thus produced, a chip (10×10 mm) with gold bumps (area: 80×80 μm; space: 30 μm; height: 15 μm; number of bumps: 288) was connected to a Ni/Au-plated Cu circuit printed substrate (electrode height: 20 μm; thickness: 0.8 mm) in the following way: The adhesive film (12×12 mm) was stuck to the Ni/Au-plated Cu circuit printed substrate (electrode height: 20 μm; thickness: 0.8 mm) at 80° C. and 10 kgf/cm². Thereafter, the separator was peeled off, and registration was made between the bumps of the chip and the Ni/Au-plated Cu circuit printed substrate. Subsequently, heat and pressure were applied from above the chip under conditions of 170° C., 75 g/bump and 20 seconds to carry out main connection. After the main connection, the chip was warped to an extent of 3.8 μm (a warp which was convex to the chip side). The connection resistance after the main connection was 20 mΩ at maximum and 12 mΩ on average, per bump, and the insulation resistance was $10^8\Omega$ or above. These values did not change even after a 1,000-cycle thermal shock test at −55 to 125° C., a 200-hour PCT test (121° C., 2 atmospheric pressures) and a 260° C. solder bath immersion test for 10 seconds, showing a good connection reliability.

EXAMPLE 3

In 350 g of ethyl acetate, 50 g of phenoxy resin and 100 g of the same acrylic rubber as in Example 1 was dissolved to obtain a 30% solution. Then, 350 g of a liquid epoxy (epoxy equivalent weight: 185) containing a microcapsular latent curing agent was added to this solution, followed by stirring and further by dispersion of 5% by volume of conductive particles comprising polystyrene cores (diameter: 5 μm) on the surfaces of which Au layers were formed, to obtain a film coating fluid. This fluid was coated on a separator (a polyethylene terephthalate film treated with silicone; thickness: 40 μm) by a roll coater, followed by drying at 100° C. for 10 minutes to produce an adhesive film of 45 μm thick. A cured product of this adhesive film had a modulus of elasticity of 1,200 MPa at 40 ° C. as measured with a dynamic viscoelasticity measuring device. Next, using the adhesive film thus produced, a chip (10×10 mm; thickness: 0.5 mm) with gold bumps (area: 80×80 μm; space: 30 μm; height: 15 μm; number of bumps: 288) was connected to a Ni/Au-plated Cu circuit printed substrate (electrode height: 20 μm; thickness: 0.8 mm) in the following way: The adhesive film (12×12 mm) was stuck to the Ni/Au-plated Cu circuit printed substrate at 80° C. and 10 kgf/cm². Thereafter, the separator was peeled off, and registration was made between the bumps of the chip and the Ni/Au-plated Cu circuit printed substrate. Subsequently, heat and pressure were applied from above the chip under conditions of 170° C., 75 g/bump and 20 seconds to carry out main connection. After the main connection, the chip was warped to an extent of 5.0 μm (a warp which was convex to the chip side). The connection resistance after the main connection was 8 mΩ at maximum and 3 mΩ on average, per bump, and the insulation resistance was $10^8\Omega$ or above. These values did not change even after a 1,000-cycle thermal shock test at −55 to 125° C., a 200-hour PCT test (121° C., 2 atmospheric pressures) and a 260° C. solder bath immersion test for 10 seconds, showing a good connection reliability.

EXAMPLE 4

In 350 g of ethyl acetate, 50 g of phenoxy resin and 100 g of the same acrylic rubber as in Example 1 was dissolved to obtain a 30% solution. Then, 350 g of a liquid epoxy (epoxy equivalent weight: 185) containing a microcapsular latent curing agent was added to this solution, followed by stirring and further by dispersion of 5% by volume of conductive particles comprising polystyrene cores (diameter: 5 μm) on the surfaces of which Au layers were formed, to obtain a film coating fluid. This fluid was coated on a separator (a polyethylene terephthalate film treated with silicone; thickness: 40 μm) by means of a roll coater, followed by drying at 100° C. for 10 minutes to produce an adhesive film of 25 μm thick. A cured product of this adhesive film had a modulus of elasticity of 1,200 MPa at 40 ° C. as measured with a dynamic viscoelasticity measuring device. Next, using the adhesive film thus produced, a chip (1.7×1.7 mm; thickness: 0.5 mm) with gold bumps (area: 50×50 μm; space: 20 μm; height: 15 μm; number of bumps: 362) was connected to a glass substrate (thickness: 1.1 mm) provided with an ITO circuit, in the following way: The adhesive film (12×12 mm) was stuck to the glass substrate provided with an ITO circuit, at 80° C. and 10 kgf/cm². Thereafter, the separator was peeled off, and registration was made between the bumps of the chip and the glass substrate provided with an ITO circuit. Subsequently, heat and pressure were applied from above the chip under conditions of 180° C., 40 g/bump and 20 seconds to carry out main connection. After the main connection, the chip had a connection resistance of 150 mΩ at maximum and 80 mΩ on average, per bump. The insulation resistance was $10^8\Omega$ or above. These values did not change even after a 1,000-cycle thermal shock test at −40 to 100° C. and a 100-hour PCT test (105° C., 1.2 atmospheric pressures), showing a good connection reliability.

EXAMPLE 5

In 400 g of ethyl acetate, 50 g of phenoxy resin and 125 g of the same acrylic rubber as in Example 1 was dissolved to obtain a 30% solution. Then, 325 g of a liquid epoxy (epoxy equivalent weight: 185) containing a microcapsular latent curing agent was added to this solution, followed by stirring and further by dispersion of 2% by volume of nickel particles (diameter: 5 μm) to obtain a film coating fluid. This fluid was coated on a separator (a polyethylene terephthalate film treated with silicone; thickness: 40 μm) by a roll coater, followed by drying at 100° C. for 10 minutes to produce an adhesive film of 25 μm thick. A cured product of this adhesive film had a modulus of elasticity of 1,000 MPa at 40 ° C. as measured with a dynamic viscoelasticity measuring device. Next, using the adhesive film thus produced, a bumpless chip (10×10 mm; thickness: 0.5 mm; pad electrode: Al; pad diameter: 120 μm) was connected in the following way, to a Ni/Au-plated Cu circuit printed substrate on the circuit of which Ni/Au-plated Cu bumps (diameter: 100 μm; space: 50 μm; height: 15 μm; number of bumps: 200) were formed: The adhesive film (12×12 mm) was stuck to the Ni/Au-plated Cu circuit printed substrate (electrode height: 20 μm; thickness: 0.8 mm) at 80° C. and 10 kgf/cm². Thereafter, the separator was peeled off, and registration was made between the Al bumps of the chip bumps and the Ni/Au-plated Cu circuit printed substrate. Subsequently, heat and pressure were applied from above the chip under conditions of 180° C., 75 g/bump and 20 seconds to carry out main connection. After the main connection, the chip had warpage of 4.8 μm (a warp which was convex to the chip side). The connection resistance after the main connection was 20 mΩ at maximum and 15 mΩ on average, per bump, and the insulation resistance was $10^8\Omega$ or above. These values did not change even after a 1,000-cycle thermal shock test at −55 to 125° C., a 200-hour PCT test (121° C., 2 atmospheric pressures) and a 260° C. solder bath immersion test for 10 seconds, showing a good connection reliability.

EXAMPLE 6

In 233 g of ethyl acetate, 50 g of phenoxy resin (PKHC, available from Union Carbide) and 50 g of an acrylic rubber (a copolymer of 40 parts of butyl acrylate, 30 parts of ethyl acrylate, 30 parts of acrylonitrile and 3 parts of glycidyl methacrylate; molecular weight: 850,000) was dissolved to obtain a 30% solution. Then, 400 g of a liquid epoxy (epoxy equivalent weight: 185; NOVACURE HX-3941, available from Asahi Chemical Industry Co., Ltd.) containing a microcapsular latent curing agent was added to this solution, followed by stirring and further by dispersion of 2% by volume of nickel particles (diameter: 5 μm) to obtain a film coating fluid. This fluid was coated on a separator (a polyethylene terephthalate film treated with silicone; thickness: 40 μm) by a roll coater, followed by drying at 100° C. for 10 minutes to produce an adhesive film of 45 μm thick. A cured product of this adhesive film had a modulus of elasticity of 1,700 MPa at 40 ° C. as measured with a dynamic viscoelasticity measuring device. Next, using the adhesive film thus produced, a chip (10×10 mm; thickness: 0.5 μm) with gold bumps (area: 80×80 μm; space: 30 μm; height: 15 μm; number of bumps: 288) was connected to a Ni/Au-plated Cu circuit printed substrate in the following way: The adhesive film (12×12 mm) was stuck to the Ni/Au-plated Cu circuit printed substrate (electrode height: 20 μm; thickness: 0.8 mm) at 80° C. and 10 kgf/cm². Thereafter, the separator was peeled off, and registration was made between the bumps of the chip and the Ni/Au-plated Cu circuit printed substrate (thickness: 0.8 mm). Subsequently, heat and pressure were applied from above the chip under conditions of 180° C., 75 g/bump and 20 seconds to carry out main connection. After the main connection, the chip had warpage of 5.7 μm (a warp which was convex to the chip side). The connection resistance after the main connection was 7 mΩ at maximum and 3 mΩ on the average, per bump, and the insulation resistance was $10^8 \Omega$ or above. These values did not change even after a 1,000-cycle thermal shock test at −55 to 125° C., a 200-hour PCT test (121° C., 2 atmospheric pressures) and a 260° C. solder bath immersion test for 10 seconds, showing a good connection reliability.

EXAMPLE 7

In 350 g of ethyl acetate, 50 g of phenoxy resin and 75 g of the same acrylic rubber as in Example 1 was dissolved to obtain a 30% solution. Then, 375 g of a liquid epoxy (epoxy equivalent weight: 185) containing a microcapsular latent curing agent was added to this solution, followed by stirring and further by dispersion of 5% by volume of conductive particles comprising polystyrene cores (diameter: 5 μm) on the surfaces of which Au layers were formed, to obtain a film coating fluid. This fluid was coated on a separator (a polyethylene terephthalate film treated with silicone; thickness: 40 μm) by a roll coater, followed by drying at 100° C. for 10 minutes to produce an adhesive film A of 25 μm thick.

Subsequently, a film coating fluid prepared in the same manner as the preparation of the above film coating fluid, except that the conductive particles with Au layers formed thereon were not dispersed, was coated on a separator (a polyethylene terephthalate film treated with silicone; thickness: 40 μm) by a roll coater, followed by drying at 100° C. for 10 minutes to produce an adhesive film B of 25 μm thick. Then, the adhesive films A and B thus obtained were laminated with a roll laminator while heating them at 40° C., to produce a double-layer structure anisotropic conductive adhesive film. A cured product of this adhesive film had a modulus of elasticity of 1,400 MPa at 40 ° C. as measured with a dynamic viscoelasticity measuring device. Next, using the adhesive film thus produced, a chip (10×10 mm; thickness: 0.5 mm) with gold bumps (area: 80×80 μm; space: 30 μm; height: 15 μm; number of bumps: 288) was connected to a Ni/Au-plated Cu circuit printed substrate (electrode height: 20 μm; thickness: 0.8 mm) in the following way: The adhesive film (12×12 mm) was stuck to the Ni/Au-plated Cu circuit printed substrate at 80° C. and 10 kgf/cm². Thereafter, the separator was peeled off, and registration was made between the bumps of the chip and the Ni/Au-plated Cu circuit printed substrate. Subsequently, heat and pressure were applied from above the chip under conditions of 170° C., 75 g/bump and 20 seconds to carry out main connection. After the main connection, the chip was warped to an extent of 5.3 μm (a warp which was convex to the chip side). The connection resistance after the main connection was 7 mΩ at maximum and 3.8 mΩ on average, per bump, and the insulation resistance was $10^8 \Omega$ or above. These values did not change even after a 1,000-cycle thermal shock test at −55 to 125° C., a 200-hour PCT test (121° C., 2 atmospheric pressures) and a 260° C. solder bath immersion test for 10 seconds, showing a good connection reliability.

EXAMPLE 8

In 350 g of ethyl acetate, 50 g of phenoxy resin and 100 g of the same acrylic rubber as in Example 1 was dissolved to obtain a 30% solution. Then, 350 g of a liquid epoxy (epoxy equivalent weight: 185) containing a microcapsular latent curing agent was added to this solution, followed by stirring and further by dispersion of 5% by volume of conductive particles comprising polystyrene cores (diameter: 5 μm) on the surfaces of which Au layers were formed, to obtain a film coating fluid. This fluid was coated on a separator (a polyethylene terephthalate film treated with silicone; thickness: 40 μm) by a roll coater, followed by drying at 100° C. for 10 minutes to produce an adhesive film of 30 μm thick. A cured product of this adhesive film had a modulus of elasticity of 1,200 MPa at 40° C. as measured with a dynamic viscoelasticity measuring device.

Next, using the adhesive film thus produced, a chip (10×10 mm; thickness: 0.5 mm) with gold bumps (area: 80×80 μm; space: 30 μm; height: 15 μm; number of bumps: 288) was connected to a Ni/Au-plated Cu circuit embedded printed substrate (electrode thickness: 20 μm; electrode height: 0 μm; thickness: 0.8 mm) in the following way: The adhesive film (12×12 mm) was stuck to the Ni/Au-plated Cu circuit embedded printed substrate at 80° C. and 10 kgf/cm². Thereafter, the separator was peeled off, and registration was made between the bumps of the chip and the Ni/Au-plated Cu circuit printed substrate. Subsequently, heat and pressure were applied from above the chip under conditions of 170° C., 75 g/bump and 20 seconds to carry out main connection. After the main connection, the chip had a warpage of 4.0 μm (a warp which was convex to the chip side). The connection resistance after the main connection was 5 mΩ at maximum and 1.5 mΩ on average, per bump, and the insulation resistance was $10^8 \Omega$ or above. Next, the chip was heated for 10 seconds at 200° C. on the side of the chip by means of a stainless steel block having a heater, and the chip was peeled from the substrate while applying a shear force to the chip. After the peeling, a residue of the adhesive film on the substrate surface was removed by rubbing with a swab impregnated with acetone to make repair. Again using the above adhesive film, a chip having the same specifications as the above was connected under the above conditions to make main connection. After the repair connection, the chip had a warpage of 4.3 μm (a warp which was convex to the chip side). The connection resistance after the main connection was 6 mΩ at maximum and 1.8 mΩ on average, per bump, and the insulation resistance was $10^8 \Omega$ or above. These values did not change even after a 1,000-cycle thermal shock test at −55 to 125° C., a 200-hour PCT test (121° C., 2 atmospheric pressures) and a 260° C. solder bath immersion test for 10 seconds, showing a good connection reliability.

Comparative Example 1

Figure 2:
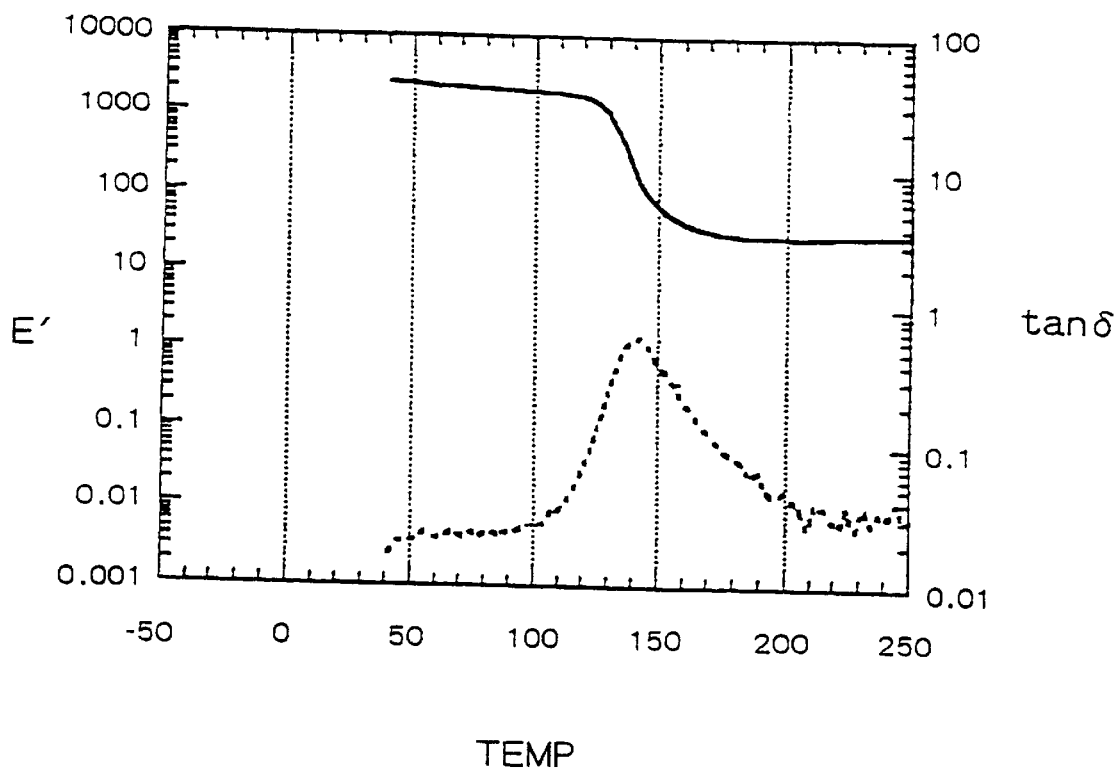
FIG. 2 is a graph showing the modulus of elasticity and dielectric dissipation factor of an adhesive-film cured product of Comparative Example 1.

In 230 g of ethyl acetate, 100 g of phenoxy resin was dissolved to obtain a 30% solution. Then, 186 g of a liquid epoxy (epoxy equivalent weight: 185) containing a microcapsular latent curing agent was added to this solution, followed by stirring and further by dispersion of 2% by volume of nickel particles (diameter: 5 μm) to obtain a film coating fluid. This fluid was coated on a separator (a polyethylene terephthalate film treated with silicone; thickness: 40 μm) by a roll coater, followed by drying at 100° C. for 10 minutes to produce an adhesive film of 45 μm thick. A cured product of this adhesive film had a modulus of elasticity of 2,600 MPa at 40 ° C. as measured with a dynamic viscoelasticity measuring device. FIG. 2 shows the results of measurement of the modulus of elasticity and dielectric dissipation factor of this adhesive-film cured product. Next, using the adhesive film thus produced, a chip (10×10 mm; thickness: 0.5 mm) with gold bumps (area: 80×80 μm; space: 30 μm; height: 15 μm; number of bumps: 288) was connected to a Ni/Au-plated Cu circuit embedded printed substrate in the following way: The adhesive film (12×12 mm) was stuck to the Ni/Au-plated Cu circuit embedded printed substrate (electrode height: 20 μm; thickness: 0.8 mm) at 80° C. and 10 kgf /cm². Thereafter, the separator was peeled off, and registration was made between the bumps of the chip and the Ni/Au-plated Cu circuit embedded printed substrate. Subsequently, heat and pressure were applied from above the chip under conditions of 170° C., 75 g/bump and 20 seconds to carry out main connection. After the main connection, the chip was warped to an extent of 6.4 μm (a warp which was convex to the chip side). The connection resistance after the main connection was 9 mΩ at maximum and 2 mΩ on average, per bump, and the insulation resistance was $10^8 \Omega$ or above. These values, however, changed after a 200-cycle thermal shock test at −55 to 125° C., a 40-hour PCT test (121° C., 2 atmospheric pressures) and a 260° C. solder bath immersion test for 10 seconds, resulting in faulty electrical conduction. As a result of cross-sectional observation of the joints, the interface of the joints was seen to have become separated at part where the faulty conduction occurred.

Comparative Example 2

In 230 g of ethyl acetate, 100 g of phenoxy resin was dissolved. Then, 186 g of a liquid epoxy (epoxy equivalent weight: 185) containing a microcapsular latent curing agent was added to the resultant solution, followed by stirring and further by dispersion of 5% by volume of conductive particles comprising polystyrene cores (diameter: 5 μm) on the surfaces of which Au layers were formed, to obtain a film coating fluid. This fluid was coated on a separator (a polyethylene terephthalate film treated with silicone; thickness: 50 μm) by a roll coater, followed by drying at 80° C. for 10 minutes to produce an adhesive film of 25 μm thick. A cured product of this adhesive film had a modulus of elasticity of 2,600 MPa at 40° C. as measured with a dynamic viscoelasticity measuring device. Next, using the adhesive film thus produced, a chip (1.7×17 mm; thickness: 0.5 mm) with gold bumps (area: 50×50 μm; 362 bumps; space: 20 μm; height: 15 μm) was connected to an ITO glass substrate (thickness: 1.1 mm) in the following way: The adhesive film (2 mm×19 mm) was stuck to the glass substrate with an ITO circuit at 80° C. and 10 kgf/cm². Thereafter, the separator was peeled off, and registration was made between the bumps of the chip and the glass substrate with an ITO circuit. Subsequently, heat and pressure were applied from above the chip under conditions of 170° C., 40 g/bump and 20 seconds to carry out main connection. The connection resistance after the main connection was 180 mΩ at maximum and 90 mΩ on average, per bump, and the insulation resistance was $10^8 \Omega$ or above. These values changed only slightly after a 10,000-cycle thermal shock test at −40 to 100° C. However, faulty electrical conduction resulted after a 100-hour PCT test (105° C., 1.2 atmospheric pressure). As a result of cross-sectional observation of the joints, the interface between the anisotropic conductive film and the glass substrate at the joints was seen to have become separated at the part where the faulty conduction occurred.

Comparative Example 3

In 533 g of ethyl acetate, 50 g of phenoxy resin and 250 g of the same acrylic rubber as in Example 1 was dissolved to obtain a 30% solution. Then, 200 g of a liquid epoxy (epoxy equivalent weight: 185) containing a microcapsular latent curing agent was added to this solution, followed by stirring and further by dispersion of 5% by volume of conductive particles comprising polystyrene cores (diameter: 5 μm) on the surfaces of which Au layers were formed, to obtain a film coating fluid. This fluid was coated on a separator (a polyethylene terephthalate film treated with silicone; thickness: 40 μm) by a roll coater, followed by drying at 100° C. for 10 minutes to produce an adhesive film of 45 μm thick. A cured product of this adhesive film had a modulus of elasticity of 70 MPa at 40 ° C. as measured with a dynamic viscoelasticity measuring device. Next, using the adhesive film (12×12 mm) thus produced, a chip (10×10 mm; thickness: 0.5 μm) with gold bumps (area: 80×80 μm; space: 30 μm; height: 15 μm; number of bumps: 288) was stuck to the Ni/Au-plated Cu circuit printed substrate (electrode height: 20 μm; thickness: 0.8 mm) at 80° C. and 10 kgf/cm². Thereafter, the separator was peeled off, and registration was made between the bumps of the chip and the Ni/Au-plated Cu circuit printed substrate. Subsequently, heat and pressure were applied from above the chip under conditions of 180° C., 75 g/bump and 20 seconds to carry out main connection. After the main connection, the chip had a warpage of 1.6 μm (a warp which was convex to the chip side). The connection resistance after the main connection was also measured. As a result, faulty conduction was seen which was ascribable to the adhesive being less removable at parts corresponding to the bumps.

What is claimed is:

1. An adhesive film for connecting circuits, comprising a heat-activated adhesive for electrically connecting electrodes in the pressing direction by heating and pressing circuit electrodes facing each other, wherein said adhesive has a modulus of elasticity of from 100 to 2,000 MPa at 40° C. after adhesion.

2. The adhesive film for connecting circuits according to claim 1, wherein said adhesive contains at least an epoxy resin, an acrylic rubber and a latent curing agent.

3. The adhesive film for connecting circuits according to claim 2, wherein said adhesive contains at least an epoxy resin, an acrylic rubber and a latent curing agent.

4. The adhesive film for connecting circuits according to claim 1, wherein from 0.2 to 15% by volume of conductive particles are dispersed in said adhesive.

5. The adhesive film for connecting circuits according to claim 2, wherein from 0.2 to 15% by volume of conductive particles are dispersed in said adhesive.

6. The adhesive film for connecting circuits according to claim 3, wherein from 0.2 to 15% by volume of conductive particles are dispersed in said adhesive.

7. A circuit board comprising:

a first circuit member having a first connecting terminal and a second circuit member having a second connecting terminal, said first connecting terminal and said second connecting terminal being so provided as to face to each other; and said first connecting terminal and said second connecting terminal being electrically connected by heating and pressing them through an adhesive put between said first connecting terminal and said second connecting terminal which are to face to each other, wherein the area of said adhesive after connection being from 2.0 to 5.0 times the area before connection.

8. A circuit board comprising:

a first circuit member having a first connecting terminal and a second circuit member having a second connecting terminal, said first connecting terminal and said second connecting terminal being so provided as to face to each other; and said first connecting terminal and said second connecting terminal being electrically connected by heating and pressing them through an adhesive put between said first connecting terminal and said second connecting terminal which are to face to each other, wherein said adhesive having a modulus of elasticity of from 100 to 2,000 MPa at 40° C. after adhesion.

9. The circuit board according to claim 7, wherein said adhesive contains at least an epoxy resin, an acrylic rubber having a glycidyl ether group in the molecule, and a latent curing agent.

10. The circuit board according to claim 8, wherein said adhesive contains at least an epoxy resin, an acrylic rubber having a glycidyl ether group in the molecule, and a latent curing agent.

11. The circuit board according to claim 7, wherein:

said first circuit member having a first connecting terminal is a semiconductor chip; and said second circuit member having a second connecting terminal is an organic insulating substrate having a second connecting terminal.

12. The circuit board according to claim 8, wherein:

said first circuit member having a first connecting terminal is a semiconductor chip; and said second circuit member having a second connecting terminal is an organic insulating substrate having a second connecting terminal.

13. The circuit board according to claim 7, wherein:

said first circuit member having a first connecting terminal is a semiconductor chip; and said second circuit member having a second connecting terminal is a multi-layer wiring board which has a surface insulating layer on which the second connecting terminal is formed, a given number of insulating layers, a given number of wiring layers provided through the insulating layers, and holes made conductive which provide electrical interconnection between given electrodes and given wiring layers; a given number of said insulating layers being formed of a resin reinforced with a glass substrate, and, when the modulus of elasticity of the surface insulating layer as measured by a dynamic viscoelasticity measuring device is represented by E1 and the modulus of elasticity of the insulating layer formed of a resin reinforced with a glass substrate as measured by the dynamic viscoelasticity measuring device is represented by E2, E1=0.01E2 to 0.5E2.

14. The circuit board according to claim 8, wherein:

said first circuit member having a first connecting terminal is a semiconductor chip; and said second circuit member having a second connecting terminal is a multi-layer wiring board which has a surface insulating layer on which the second connecting terminal is formed, a given number of insulating layers, a given number of wiring layers provided through the insulating layers, and holes made conductive which provide electrical interconnection between given electrodes and given wiring layers; a given number of said insulating layers being formed of a resin reinforced with a glass substrate, and, when the modulus of elasticity of the surface insulating layer as measured by a dynamic viscoelasticity measuring device is represented by E1 and the modulus of elasticity of the insulating layer formed of a resin reinforced with a glass substrate as measured by the dynamic viscoelasticity measuring device is represented by E2, E1=0.01E2 to 0.5E2.

15. The circuit board according to claim 7, wherein:

said first circuit member having a first connecting terminal is a semiconductor chip; and said second circuit member having a second connecting terminal is a wiring substrate comprising an insulating substrate in the surface portion of which the second connecting terminal is buried.

16. The circuit board according to claim 8, wherein:

said first circuit member having a first connecting terminal is a semiconductor chip; and said second circuit member having a second connecting terminal is a wiring substrate comprising an insulating substrate in the surface portion of which the second connecting terminal is buried.

17. The circuit board according to claim 7, wherein from 0.2 to 15% by volume of conductive particles are dispersed in said adhesive.

18. The circuit board according to claim 8, wherein from 0.2 to 15% by volume of conductive particles are dispersed in said adhesive.

19. The filmy adhesive for connecting circuits according to claim 1, wherein the area of said adhesive after connection is from 2.0 to 5.0 times the area before connection.

20. A circuit board comprising:

a first circuit member having a first connecting terminal; and a second circuit member having a second connecting terminal;

said first connecting terminal and said second connecting terminal being so provided as to face to each other; and said first connecting terminal and said second connecting terminal being electrically connected by heating and pressing them through an adhesive put between said first connecting terminal and said second connecting terminal which are to face to each other, wherein:

said first circuit member having a first connecting terminal being a semiconductor chip; and said second circuit member having a second connecting terminal being a wiring substrate comprising an insulating substrate in the surface portion of which the second connecting terminal is buried.

21. A circuit board comprising:

a first circuit member having a first connecting terminal; and a second circuit member having a second connecting terminal;

said first connecting terminal and said second connecting terminal being so provided as to face to each other; and said first connecting terminal and said second connecting terminal being electrically connected by heating and pressing them through an adhesive put between said first connecting terminal and said second connecting terminal which are to face to each other, wherein:

said first circuit member having a first connecting terminal being a semiconductor chip; and said second circuit member having a second connecting terminal being a multi-layer wiring board which has a surface insulating layer on which the second connecting terminal is formed, a given number of insulating layers, a given number of wiring layers provided through the insulating layers, and holes made conductive which provide electrical interconnection between given electrodes and given wiring layers; a given number of said insulating layers being formed of a resin reinforced with a glass substrate, and, when the modulus of elasticity of the surface insulating layer as measured by a dynamic viscoelasticity measuring device is represented by E1 and the modulus of elasticity of the insulating layer formed of a resin reinforced with a glass substrate as measured by the dynamic viscoelasticity measuring device is represented by E2, $$E1 = 0.01E2 \text{ to } 0.5E2;$$

said adhesive containing at least an epoxy resin, an acrylic rubber having a glycidyl ether group in the molecule, and a latent curing agent.

22. A circuit connecting method for electrically connecting circuit electrodes in a pressing direction comprising the steps of:

placing a heat-activated adhesive to be sandwiched between the circuit electrodes facing each other, and heating and pressing the heat-activated adhesive, wherein said adhesive has a modulus of elasticity of from 100 to 2,000 MPa at 40° C. after adhesion.

23. A method for manufacturing a circuit board, comprising the steps of:

placing an adhesive between a first connecting terminal provided at a first circuit member and a second connecting terminal provided at a second circuit member provided to face each other; and heating and pressing the adhesive so as to electrically connect said first connecting terminal and said second connecting terminal, wherein said adhesive after connection has an area from 2.0 to 5.0 times the area before connection.

24. A method for manufacturing a circuit board, comprising the steps of:

placing an adhesive between a first connecting terminal provided at a first circuit member and a second connecting terminal provided at a second circuit member provided to face each other; and heating and pressing the adhesive so as to electrically connect said first connecting terminal and said second connecting terminal, wherein said adhesive has a modulus of elasticity of from 100 to 2,000 MPa at 40° C. after adhesion.

25. A method for manufacturing a circuit board, comprising the steps of:

placing an adhesive between a first connecting terminal provided at a first circuit member and a second connecting terminal provided at a second circuit member provided to face each other; and heating and pressing the adhesive so as to electrically connect said first connecting terminal and said second connecting terminal, wherein:

said first circuit member is a semiconductor chip, and said second circuit member is a wiring substrate having said second connecting terminal embedded in a surface of an insulating substrate.

26. A method for manufacturing a circuit board, comprising the steps of:

placing an adhesive between a first connecting terminal provided at a first circuit member and a second connecting terminal provided at a second circuit member provided to face each other; and heating and pressing the adhesive so as to electrically connect said first connecting terminal and said second connecting terminal, wherein:

said first circuit member is a semiconductor chip;

said second circuit member is a multi-layer wiring board which has a surface insulating layer on which the second connecting terminal is formed, the given number of insulating layers, a given number of wiring layers provided through the insulating layers, and conductive holes which provide electrical interconnection between given electrodes and given wiring layers, said given number of insulating layers is formed of a resin reinforced with a glass substrate; and when the modulus of elasticity of the surface insulating layer as measured by the a dynamic viscoelasticity measuring device is represented by E1 and the modulus of elasticity of the insulating layer formed of a resin reinforced with a glass substrate as measured by the dynamic viscoelasticity measuring device is represented by E2, $$E1 = 0.01E2 \text{ to } 0.5E2;$$

said adhesive containing at least an epoxy resin, an acrylic rubber having a glycidyl ether group in the molecule, and a latent curing agent.

* * * * *

UNITED STATES PATENT AND TRADEMARK OFFICE
CERTIFICATE OF CORRECTION

PATENT NO. : 6,328,844 B1  Page 1 of 1
DATED : December 11, 2001
INVENTOR(S) : Itsuo Watanabe et al.

It is certified that error appears in the above-identified patent and that said Letters Patent is hereby corrected as shown below:

<u>Column 14,</u>
Line 52, amend claim 3 to read as follows:
-- 3. (Twice Amended) The adhesive film for connecting circuits according to claim 2, wherein said acrylic rubber has a glycidyl ether goup in the molecule. --.

Signed and Sealed this

Sixteenth Day of July, 2002

*Attest:*

JAMES E. ROGAN
*Attesting Officer*   *Director of the United States Patent and Trademark Office*